United States Patent [19]
Song

[11] Patent Number: 6,069,519
[45] Date of Patent: May 30, 2000

[54] LEAKAGE IMPROVED CHARGE PUMP FOR NONVOLATILE MEMORY DEVICE

[75] Inventor: Paul Jei-Zen Song, Sunnyvale, Calif.

[73] Assignee: Integrated Silicon Solution Inc., Santa Clara, Calif.

[21] Appl. No.: 09/095,199

[22] Filed: Jun. 10, 1998

[51] Int. Cl.[7] .................................................. G11C 7/00
[52] U.S. Cl. ............... 327/536; 365/185.18; 365/185.09; 365/189.11
[58] Field of Search ................................ 365/230.1, 226, 365/227, 185.01, 185.18, 185.09, 189.11; 327/536

[56] References Cited

U.S. PATENT DOCUMENTS

| | | | |
|---|---|---|---|
| 5,673,232 | 9/1997 | Furutani | 365/226 |
| 5,740,109 | 4/1998 | Morton et al. | 327/536 |
| 5,828,621 | 10/1998 | Tanzawa et al. | 365/229 |
| 5,877,635 | 3/1999 | Lin | 326/83 |

*Primary Examiner*—Viet Q. Nguyen
*Attorney, Agent, or Firm*—Pennie & Edmonds LLP

[57] ABSTRACT

A distribution charge pump is disclosed that reduces leakage from a VPP node where a programming voltage (VPP) is provided. The distribution charge pump includes a pump section and a biasing network. The pump section, in response to input signals at 0V or VCC, generates corresponding output signals at 0V or VPP, respectively. Typically, VCC can be between 2V and 5V and VPP can be between 11V and 15V. The pump section includes two n-channel transistors that bootstrap each other to cooperatively pull up the output node to VPP in response to an input signal of VCC. When the charge pump is active, one of the transistors, a native-mode device, transfers charge from the VPP node to an internal node where charge is stored by a capacitor. The biasing network reduces leakage current from the VPP node through the native-mode transistor when the charge pump is inactive. The biasing network accomplishes this by setting the voltage at the internal node when the charge pump is inactive so that the native-mode transistor is back biased and, therefore, off. The biasing network includes conventional transistors, one of which has a source coupled to a virtual ground signal that predominately determines the back-bias voltage level.

20 Claims, 5 Drawing Sheets

LEAKAGE IMPROVED CHARGE PUMP FOR NONVOLATILE MEMORY DEVICE

The present invention relates generally to nonvolatile semiconductor memory systems, such as EEPROMS, and more specifically to an on-chip charge pump for nonvolatile memories.

BACKGROUND OF THE INVENTION

EEPROM memories are known in the art. An individual EEPROM memory cell includes a metal-oxide-semiconductor ("MOS") device having spaced-apart drain and source regions fabricated on a substrate and defining a channel region therebetween. A thin gate oxide layer lies between the channel region and a floating, charge-retaining storage gate that is unconnected to the outside. A very thin tunneling oxide partially overlaps a portion of the drain area and a control gate at least partially overlies the floating gate (FG) and is insulated therefrom.

In practice, a plurality of such memory cells is arrayed in addressable rows and columns to form a memory array. Individual cells in the array are accessed for purposes of writing, reading or erasing data by decoding row and column information.

Typically, the control gates for a group of cells in a given row are formed from a continuous strip of conductive material. A typical row might comprise, for example, a group of eight cells that collectively store one byte. Each row of cells can only be accessed when a corresponding word line, abbreviated "WL", is asserted. For a given column in the array, the drain leads of all cells in the column are coupled to a so-called bit line, abbreviated "BL", through which the cells are read and erased. The source leads of the various cells are collectively switchably coupled to a virtual ground representing one of several potential levels, depending upon whether cells in the array are to be programmed/erased or are to be read.

Within the memory array, an individual cell is addressed and thus selected for reading or for programming (e.g., writing or erasing) by specifying its row (or word line) as an x-axis coordinate, and its column (or bit line) as a y-axis coordinate. A 16 K-bit memory, for example, may comprise an array of 128×128 bits, in which there are 128 x-axis word lines and 128 y-axis bit lines. Commonly, blocks of memory cells are collectively grouped into words, blocks or sectors. Cell addressing is accomplished by coupling address bits to x-decoders and to y-decoders whose respective outputs are coupled to word lines and bit lines in the array.

Writing an addressed MOS memory cell occurs in a write mode by grounding the control gate and coupling the drain to a high positive potential of perhaps +15 volts DC (abbreviated as "V" or "VDC"). This causes electrons to tunnel out of the floating gate across the tunneling oxide to the drain, which leaves positive charge on the floating gate. As a result, the transistor turns on (i.e., maintains a significant current flow during read mode). Typically, an EEPROM cell is erased by coupling the cell's control gate to a high positive potential of perhaps +15 VDC, and drain, source and substrate to 0 VDC, which encourages negative charges to tunnel from the drain-extension to the floating gate.

In a read mode, the charge stored on the floating gate of an addressed MOS memory cell is read by coupling perhaps +5 VDC to the control gate, and reading drain-to-source current. The presence or absence of charge on the stored gate defines a binary "1" or "0" bit that is read-out from the addressed memory cell by a sense amplifier coupled to the bit line.

In the various read, program or erase modes, the gate, drain and source voltages are determined by the voltages on respective combinations of the word lines, bit lines and, possibly, other control lines. Some non-volatile memory systems provide a separate high-voltage power supply to drive these lines to the high positive potential (e.g., +15 VDC) necessary to achieve the high gate and drain voltages necessary for writing and erasing the EEPROM cells. Other EEPROM memory systems, which provide only a single 2 VDC to 5 VDC power supply, achieve the requisite high voltages through a main charge pump that "pumps" the 2–5 VDC signals up to high voltage (e.g, +15 VDC) signals, which can then be used to write or erase the EEPROM cells. The memory systems also provide distribution charge pumps that transform normal logic signals at 0 VDC and VCC respectively to 0 VDC and a high voltage state.

Referring to FIG. 2A, there is shown a circuit diagram of one such prior art distribution charge pump for use in a single-supply EEPROM. The circuit is enabled by a high-to-low transition of the 2–5 VDC input signal (INPUT) to generate an output signal (OUTPUT) that rises from 0 VDC to a large positive potential. The resulting OUTPUT signal is coupled to an appropriate word line (WL) by an X decoder so that the appropriate cell can be programmed.

The charge pump of FIG. 2A includes an input buffer I1, a NMOS enhancement-mode pass transistor MI2 with threshold voltage ($Vt_{MI2}$) between 0 and 0.9 volts, a MOS capacitor MC and two NMOS enhancement-mode pump transistors MP1 and MP2. In an alternative version of the same circuit, the transistors MP1 and MP2 could also be NMOS native mode transistors. Input signals (INPUT) in need of pumping are input to the distribution charge pump at the input of the buffer I1. The output of the input buffer I1 (node X) is coupled to the drain of the transistor MI2, whose gate and source are respectively coupled to VCC (e.g., +5 VDC) and node C. Also coupled to node C are the output (OUTPUT) of the charge pump, the source of the transistor MP1 and the gate of the transistor MP2. The drain and source of MP2 are respectively tied to a VPP node that provides a programming voltage VPP (e.g., +15 VDC), which is typically generated by a main charge pump (not shown) from the 2–5 VDC output of the single power supply, and node B. Node B is also coupled to one terminal of the MOS capacitor MC and to the gate and drain of the transistor MP1. The other terminal of the capacitor MC (node A) is coupled to a clock signal φ; consequently, the capacitor MC stores charge at node B when the clock signal makes a low to high transition and discharges when the clock signal makes a high to low transition.

FIGS. 2B, 2C and 2D respectively show voltage versus time plots of the clock signal φ, the signal at node B and the OUTPUT signal at node C. The operation of the prior art circuit of FIG. 2A is now described in reference to these figures. Initially (at time 2-0), the INPUT signal (not shown) makes a transition from high to low and, in response, the input buffer I1 outputs a low to high signal (not shown) that is coupled to node X. Because the gate of the transistor MI2 is tied to VCC, a high signal at node X is always passed by the transistor MI2 to node C and the output (OUTPUT) of the charge pump. This means that, following the low to high transition of the INPUT signal at time 2-0, the voltage at node C goes to VCC−$Vt_{MI2}$ (where $Vt_{MI2}$ is the threshold voltage of the pass transistor MI2). Because the transistor MP2 turns on anytime the voltage difference between its gate (node C) and source (node B) exceeds its threshold voltage ($Vt_{MP2}$), as soon as node C goes high, the transistor MP2 turns on and pulls up the voltage at node B ($V_B$) to VCC−$Vt_{MI2}$−$Vt_{MP2}$. This $V_B$ level does not immediately turn on the transistor MP1, whose source (node C) is still more positive than its gate (node B).

At time 2-1, the clock signal φ rises to VCC, which places the capacitor MC in a charge storage mode. At the same time, the already-on transistor MP2 couples current and charge from the VPP node to node B, where the charge contributed by VPP is stored by the capacitor MC. This accumulated charge causes the voltage at node B ($V_B$) to rise, which eventually causes the transistor MP1 to turn on. Once turned on, the transistor MP1 pulls up the voltage of the OUTPUT signal (node C) until it rises to within a threshold drop $Vt_{MP1}$ (of transistor MP1) of $V_B$. As the result of node C being pulled up, the transistor MP2 turns on even more strongly when the clock φ makes a high to low transition, which causes $V_B$ to stay near its previous peak voltage despite the charge drawn from node B by the capacitor MC. This in turn causes the transistor MP1 to turn on harder the next time the clock φ goes from low to high (i.e., the nodes B and C bootstrap each other). Based on the configuration of the circuit elements MC, MP1 and MP2, while the clock signal is high, $V_B$ and the OUTPUT signal stabilize (at higher than previous levels), with $V_B$ within $Vt_{MP2}$ of the OUTPUT voltage. The difference between the highest $V_B$ levels for subsequent pumping cycles is denoted "Δ".

When the clock signal goes low (e.g., at time 2-2), node B begins to discharge through the capacitor MC, causing the voltage at node B ($V_B$) to drop. This discharge does not affect the OUTPUT signal, which is isolated from node B by the (now-off) transistor MP1. At some point while the clock signal is low, the voltage at node B falls more than $Vt_{MP2}$ below this OUTPUT voltage, which causes the transistor MP2 to strongly turn on. Once the transistor MP2 turns on, it supplies as much charge to node B from the VPP node as is discharged by the capacitor MC, which stabilizes $V_B$. The circuit elements of FIG. 2A are selected so that the drop in $V_B$ during the low phase of any pumping cycle (denoted on FIG. 2C as "-ΔB") is always less than the voltage gain Δ. This means that, over subsequent pumping cycles, each of which proceeds as described above, the OUTPUT of the charge pump is able to continue rising until it reaches VPP+$Vt_{MP2}$ (FIG. 2D).

Thus, the prior art provides a distribution charge pump that provides a positive high voltage output signal in response to a logic '1' input signal. However, the fact that the positive high voltage output signal goes to VPP+$Vt_{Mp2}$, a voltage level higher than the optimum level for programming (i.e., VPP), could cause high voltage-related problems in the flash cells being programmed. These high voltage problems include breakdown, punch-through and field-transistor turn-on.

The efficiency of the distribution charge pump is related to the sizes of the threshold voltages $Vt_{Mp1}$ and $Vt_{MP2}$. For the charge pump to have optimum efficiency it is desirable for both threshold voltages to be as low as possible for the given operating conditions. For example, at low temperatures, $Vt_{MP1}$ and $Vt_{MP2}$ might be 0.7V and -0.3V, respectively, and, at high temperatures, $Vt_{Mp1}$, and $Vt_{MP2}$ might be 0.5V and -0.5V, respectively. Due to these low thresholds, when the pump is off (especially at high temperatures), there is likely to be significant leakage between the VPP node to node C via the transistors MP1 and MP2. This is caused by the fact that, when node C is at ground, the transistor MP2 (with a negative Vt) is able to turn on, causing the voltage at node B to go to approximately 0.5V. Because this is the same as $Vt_{MP1}$, this causes the transistor MP1 to turn on, which allows leakage current to flow between the VPP and ground nodes. Leakage is a problem for two reasons. First, it wastes power. Second and more important, as VPP is a relatively weak, internally-generated power supply voltage, the leakage current could cause the VPP voltage level to sag, which could affect memory operations that require a stable VPP.

SUMMARY OF THE INVENTION

The present invention is a distribution charge pump for use in an EEPROM/flash memory array that prevents leakage from a VPP node to ground (GND) whenever the pump is inactive.

More specifically, the present invention is a distribution charge pump that includes a charge pump section and a biasing network (120). The charge pump section is implemented entirely without high voltage p-channel devices and has an input coupled to an input signal, an output coupled to an output signal and a clock input coupled to an externally-generated clock signal. The charge pump section is configured, when the input signal and the clock signals are active, to pump the output signal approximately to a program voltage (VPP) that is established at the VPP node. The biasing network, which is responsive to the same input signal, is configured to reduce current leakage by the charge pump from the VPP node when the input signal is inactive.

Referring to FIG. 3A, a preferred embodiment of the charge pump section includes a first n-channel, native-mode transistor (MP2), a capacitor (MC) and a second n-channel transistor (MP1). The first n-channel, native-mode transistor (MP2), using charge from the VPP node, pulls up the voltage at a first internal node (B) when the input signal is active. The capacitor (MC) is configured to store charge at the first node (B) when the clock signal is high and discharge when the clock signal is low. The second n-channel transistor (MP1) is configured to couple the output (node C) to the first node (B) whenever the first node voltage exceeds a second threshold associated with the second n-channel transistor (MP1). The transistors are configured so that less charge is lost from the first node (B) when the clock makes a downward transition than is gained when the clock makes an upward transition, which results in increasing voltage at the internal node (B) and the output node (C).

The preferred charge pump section can also include a two input NAND gate having a first input responsive to the first input signal, a second input coupled to a master clock node that supplies a master clock signal of the same period as the clock signal, and an output that provides the clock signal. The NAND gate supplies the clock signal to the capacitor only when the input signal is active so that leakage from the capacitor (MC) is eliminated when the input signal is inactive.

A preferred embodiment of the biasing network (120) includes a third n-channel, native-mode transistor (M3) and a fourth n-channel transistor (M4). The third n-channel, native-mode transistor (M3) has an associated third threshold and a gate, source and drain coupled respectively to a second internal node (D), the first node (B) and a VCC node that provides a VCC voltage. The fourth n-channel transistor (M4) has an associated fourth threshold and a gate, source and drain coupled respectively to the input signal, a virtual ground signal (GND2) and the second node (D). In the preferred embodiment, the GND2 signal is established at the threshold voltage of an n-channel enhancement device, such as the transistor M4.

When the input signal is inactive, the biasing network (120) sets the voltage at the second node (D) approximately to the GND2 signal level, causing the third n-channel transistor to turn on and the first node (B) voltage to be established at a bias voltage ($V_B$) that approximately equals the difference of the GND2 signal level and the third threshold. When the input signal is inactive, the gate of the first n-channel transistor (MP2) is at 0V; thus, its gate-source voltage ($V_{GS}$) equals 0V-$V_B$. Because -$V_B$ is virtually certain (for normal operating conditions) to be smaller than a first threshold voltage associated with the first n-channel transistor (MP2), no leakage current is able to flow when the input signal is inactive. For example, assuming a GND2 signal level of 0.5V and first and third thresholds of -0.2V, $V_{GS}$ would be -0.7V, which is much smaller than the -0.2V first threshold. Preferably, the first and third transistors (MP2, M3) have similar characteristics, which ensures that -$V_B$ is less than the first threshold voltage.

The preferred embodiment of the biasing network can also include a high voltage mode circuit that adjusts the level of the GND2 signal depending on whether the charge pump is enabled for high voltage mode operations as indicated by a high voltage mode (HV) signal. When the HV signal is active, the high voltage mode circuit sets the GND2 signal to at least the threshold voltage of a first selected n-channel enhancement mode transistor.

DESCRIPTION OF THE PREFERRED EMBODIMENT

Figure 1:
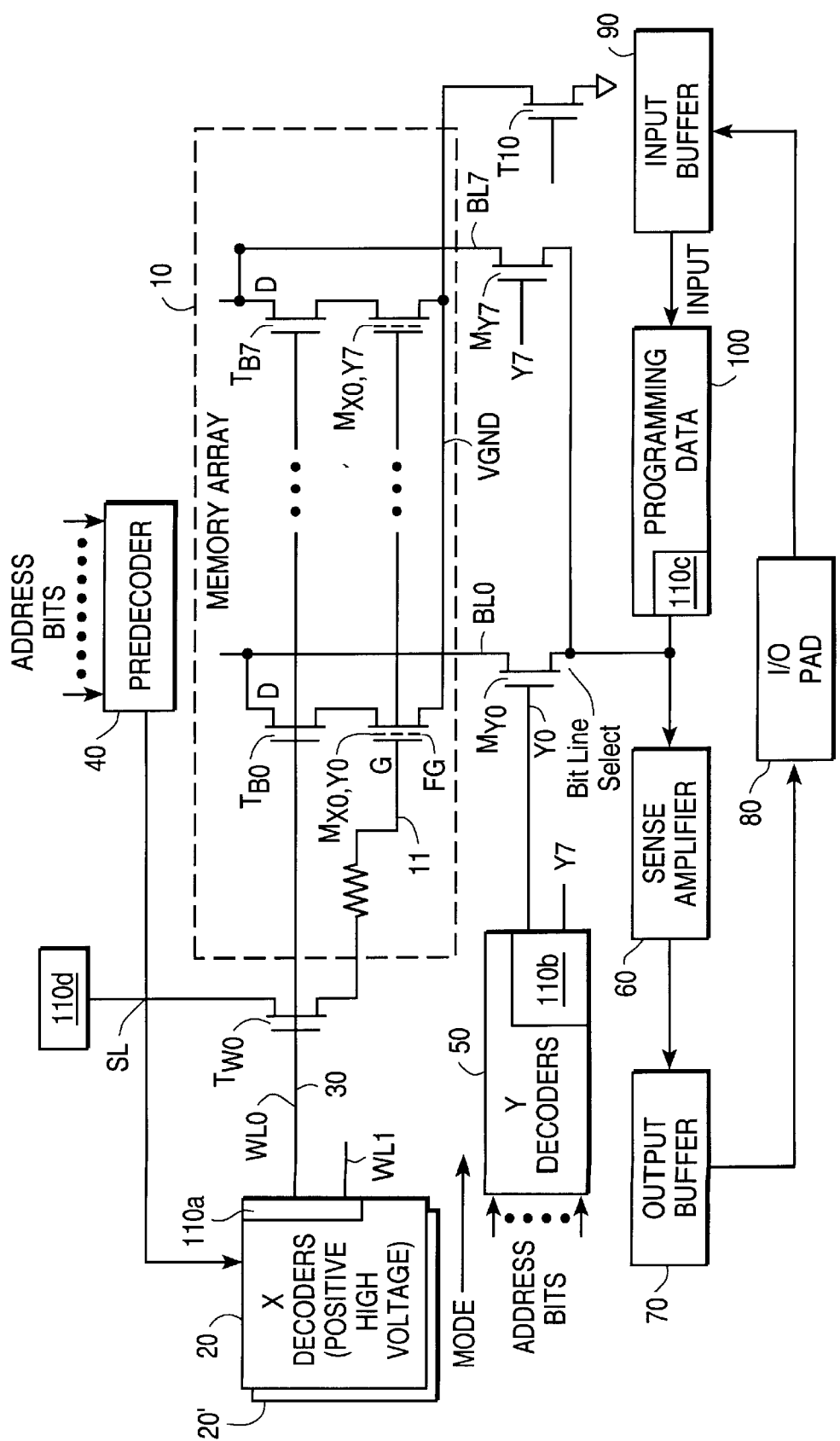
FIG. 1 is a block diagram of an EEPROM system with which the present invention may be practiced.

FIG. 1 is a block diagram of an EEPROM or flash memory cell architecture with which the present invention may be practiced. This architecture includes a memory array 10, and various components that interact with the memory array 10, including x-decoders 20, y-decoders 50, a predecoder 40, a sense amplifier 60, an output buffer 70, an I/O pad 80, an input buffer 90, a programming data interface 100 and sense lines SL. Each of the x-decoders 20, y-decoders 50, interface 100 and sense lines SL include a charge pump 110, which can be implemented in accordance with the present invention.

The memory array 10 includes a plurality of MOS memory cells $M_{x,y}$, such as cells $M_{x0,y0}$ and $M_{x0,y7}$, each cell having source and drain regions, a floating gate (denoted FG) and a control gate (denoted CG). A plurality of such cells in a given horizontal (or x-axis) row have their control gates coupled together by a conductor 11, one end of which is coupled to the source of a depletion-mode, enhancement-mode or native n-channel sense line selecting transistor, such as $T_{W0}$, which can have a threshold voltage between −3 and 0.9 volts. The drain of each of the cells is coupled to the source of a bit line switching transistor $T_{Bi}$ (where the subscript "Bi" denotes the bit index of the memory cell to which the bit line switching transistor $T_{Bi}$ is coupled) and the source of each of the cells is connected to a virtual ground node (VGND), which can be set to various, mode-dependent voltage levels through the transistor T10, the drain of which is coupled to the VGND node. The word line switching transistor $T_{W0}$ has a gate coupled to a word line (e.g., WL0) that is controlled by an x-decoder 20 and a drain coupled to a sense line (SL) that is controlled by a sense line generator (not shown). The bit line switching transistor $T_{Bi}$ has a gate coupled to the same word line and a drain coupled to a corresponding bit line (BLi) output by a y-decoder 50. Whether a particular cell $M_{x,y}$ is programmed, erased or read depends on the voltage levels of the SL, WL, and $BL_i$ signals input to the bit line and word line switching transistors coupled that cell.

For example, in the memory architecture shown in FIG. 1, a memory cell $M_{x0,y0}$ is written by setting its associated word line and bit line selects to the positive high voltage level (15 VDC) while, simultaneously, the sense line is tied to 0 VDC, the VGND node is allowed to float and the programming data circuit 100 sends out a high potential (15 VDC). Under these conditions, the bit line switching transistor $T_{B0}$ turns on and sends 15V–Vt to the drain of its associated memory cell $M_{x0,y0}$. Simultaneously, the word line switching transistor $T_{W0}$ also turns on and sends the 0 VDC signal provided on the sense line to the control gate of the memory cell $M_{x0,y0}$. The resulting drain tunneling oxide region to control gate high positive potential (15V–Vt) attracts electrons out of the floating gate FG, leaving positive charge on the FG after the completion of the write. During this write process, no drain-source DC current flows in the cell because the VGND node is allowed to float.

Similarly, a cell $M_{x0,y0}$ is erased with data from the interface 100 by holding its associated word line at the positive high voltage level while the sense line and VGND are set at 0 VDC and 15 VDC, respectively, and the bit line BL0 is grounded to 0. This produces high control gate to drain tunneling oxide region potential and causes electrons to tunnel into the floating gate, leaving negative charge after the erase procedure is completed.

Figure 3A:
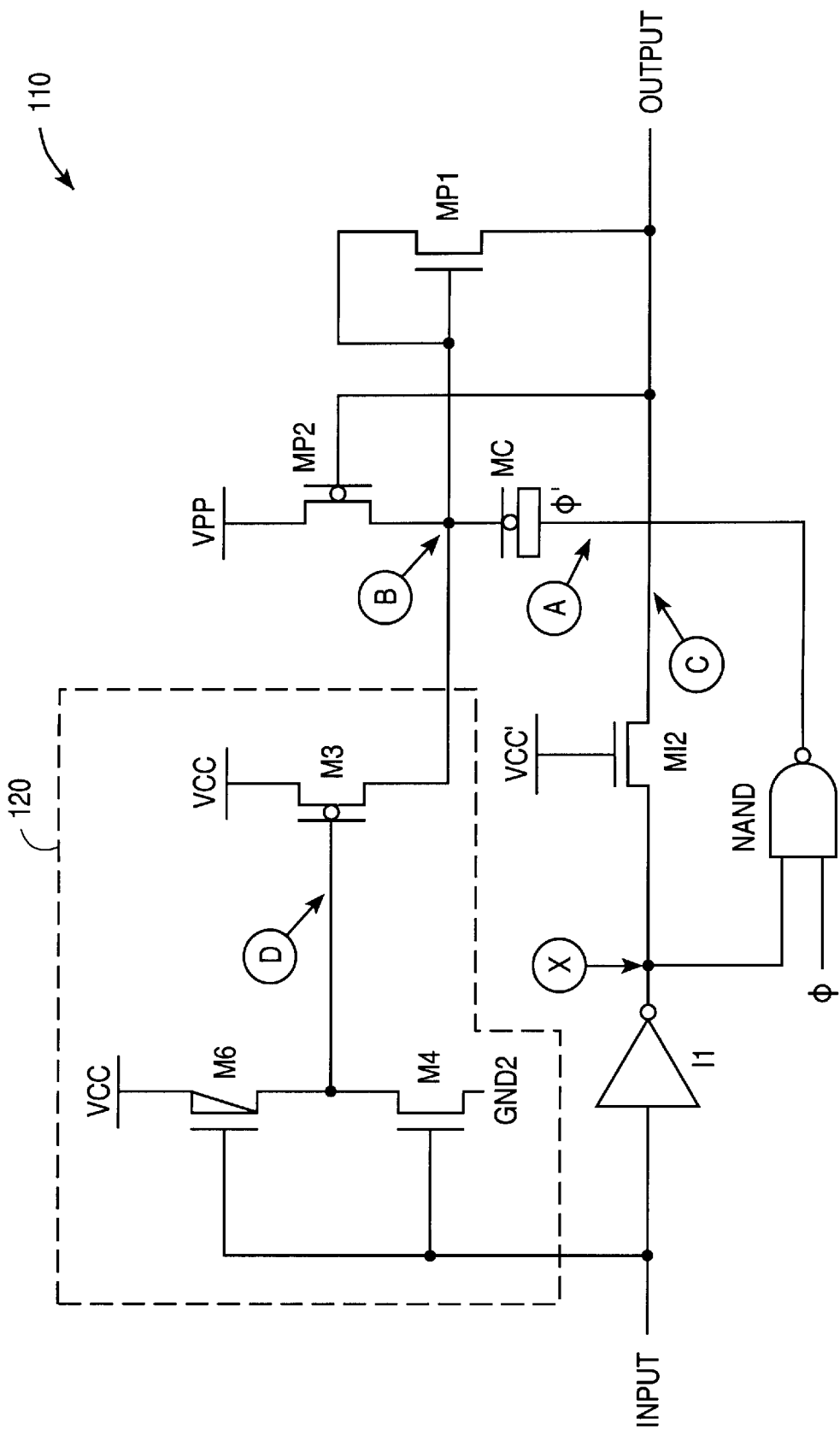
FIG. 3A is a block diagram of a preferred embodiment of the distribution charge pump of the present invention.

Each word line is selectively pulled-up or pulled-down to a program, read or erase voltage level by an x-axis high voltage decoder. For example, in FIG. 1, the word lines WL0 and WL1 are controlled respectively by the decoders 20 and 20'. Each decoder 20 also includes a charge pump 110a, which, as described above, provides the positive high voltage signals needed to program and erase the EEPROM cells. The charge pump 110a of the preferred embodiment is described below in reference to FIG. 3.

The memory of FIG. 1 also includes a predecoder 40, which receives input address information from a host device such as a microprocessor computing system (not shown) and outputs decoded signals to the x-decoders 20. In response, the appropriate x-decoders 20 will pull an associated word line up to a necessary voltage level as described above. More specifically, the positive high voltage x-decoder 20 pulls a selected word line WL in memory array 10 up to about +15 VDC (i.e., VPP) in program/write mode, and up to VCC (e.g., ≈+5 VDC) in read mode. If word line 30 is unselected, in program/write mode, decoder 20 pulls the word line down to 0 VDC.

A y-decoder 50 also receives address information from the host device. In conventional fashion, a plurality of cells in a column in the array have their source regions coupled together to form a bit line (BL). The output from the y-decoder 50 turns-on a y-axis select transistor, e.g., $M_{Y0}$, which couples the bit line signal to the input of a sense amplifier 60 that reads the stored bit of information in the address-selected cell $M_{x0,y0}$. If, instead, cell $M_{x0,Y7}$ is to be read, the y-decoder 50 will turn on the select transistor $M_{Y7}$. For ease of illustration, only two bit lines, BL0 and BL7, are depicted in FIG. 1, although in practice, array 10 will include a great many bit lines. As do the x-decoders, the each y-decoders also include a charge pump 110b, the preferred embodiment of which is described in reference to FIG. 3.

In a read mode of operation, the sense amplifier output is coupled through an output buffer 70. The "0" or "1" signal stored in an addressed cell $M_{x,y}$ is then provided to an input/output pad 80, from where the information may be accessed by the host device.

Data to be stored within the array 10 is coupled to the input/output pad 80 by the host device, from where the data is coupled to an input buffer 90. The output of buffer 90 is provided to an interface 100 that provides suitable programming data for the array. Because writing a memory cell requires high voltage (e.g., 15V) to appear on the corresponding bit line, the interface 100 also includes a distribution charge pump 110c that pumps the 5 volt INPUT to the required level.

The system shown in FIG. 1 also receives from the host device MODE signals commanding either a program/write mode, erase mode, or a read mode.

Figure 2A:
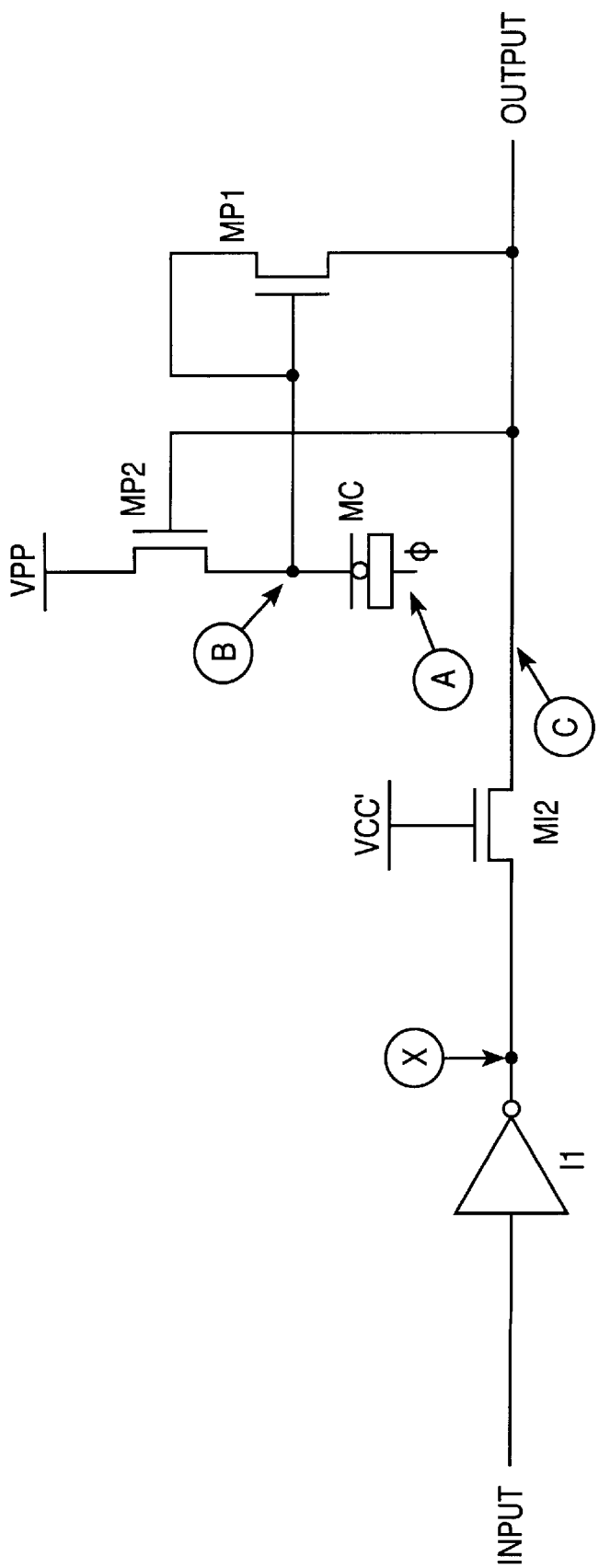
FIG. 2A is a block diagram of a prior art charge pump for a nonvolatile memory.

Referring to FIG. 3, there is shown a circuit diagram of the distribution charge pump 110 of the present invention, which can be incorporated in the memory described above, particularly in the x- and y-decoders 20, 50, the input buffer 100 and in the sense lines SL. The circuit 110 is enabled by a high-to-low transition of the input signal (INPUT) to generate an output signal (OUTPUT) that rises from 0 VDC to approximately VPP in the manner described for the prior art (FIG. 2A). The resulting OUTPUT signal is coupled to an appropriate word line (WL) by the positive high voltage X decoders (FIG. 1) so that the appropriate cell can be programmed.

The charge pump of FIG. 3 shares with the prior art charge pump (FIG. 2A) an inverting input buffer I1, an NMOS enhancement-mode pass transistor MI2, a MOS capacitor MC and two pump transistors MP1 and MP2. In the preferred embodiment, the transistor MP2 is an n-channel native-mode device and the transistor MP1 is an n-channel enhancement mode device. Additional circuit elements provided by the preferred embodiment include a native-mode pullup transistor M3, an n-channel pulldown transistor M4, a p-channel pullup transistor M6, a NAND gate. At typical operating temperatures the transistor MP1 has a threshold $Vt_{MP1}$ of between approximately 0.5V and 0.7V and both of the native-mode transistors MP2 and M3 have thresholds ($Vt_{MP2}$ and $Vt_{M3}$, respectively) of between approximately −0.2V and 0.3V. The transistors M4 and M6 have threshold voltages typical for their types. That is, the n-channel transistor M4 has a threshold ($Vt_{M4}$) of between approximately 0.5V and 0.7V and the p-channel transistor M6 has a threshold $Vt_{M6}$ of between approximately −0.5V and −0.7V. Note that the native-mode transistor MP2 is an n-channel transistor, which is why it can have negative threshold voltages. It would be preferable to use a p-channel transistor for the element MP2; however, the preferred embodiment is intended to be implemented without high-voltage p-channel devices, which would be required for the device MP2.

Figure 2B:
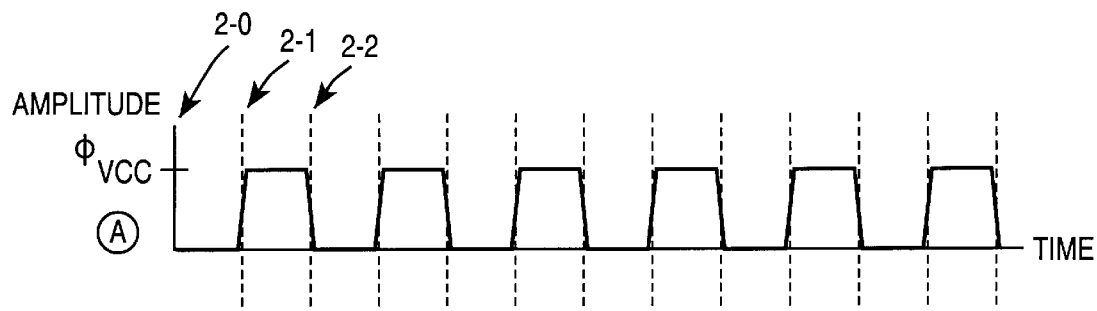
FIG. 2B is a voltage versus time plot of the clock signal provided at node A of FIG. 2A.
Figure 2C:
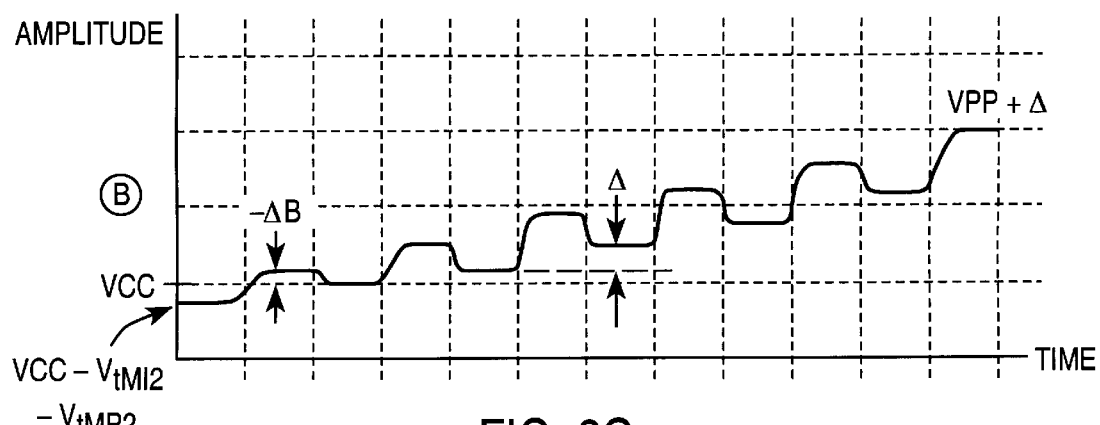
FIG. 2C is a plot of the voltage at node B of FIG. 2A while the charge pump is enabled.
Figure 2D:
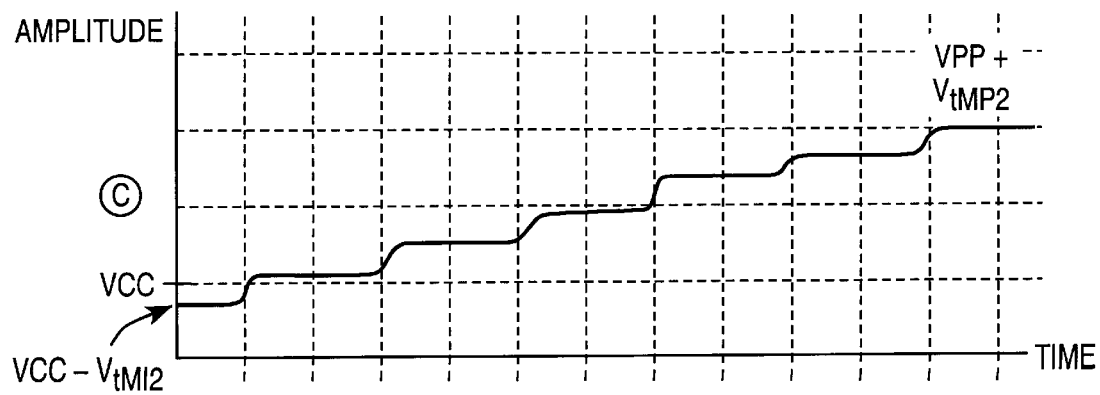
FIG. 2D is a plot of the output signal provided at node C by the charge pump of FIG. 2A.

The input buffer 11 is an inverting buffer that provides at node X an output that is coupled the drains, or inputs, of the transistor MI2 and one of the inputs of the NAND gate. The source, or output, of the transistor MP1 is tied to a node C, which is also coupled to the output (OUTPUT) of the distribution charge pump, the output of the transistor MI2 and the gate of the transistor MP2. A clock signal φ (shown in FIG. 2B) is coupled to the other input of the NAND gate, which generates from the clock signal φ and the signal at node X a gated clock signal φ' that is coupled to the MOS capacitor at node A. Other inputs to the charge pump include: VCC', which is coupled to the gate of the transistor MI2; and VPP, which is generated by the main charge pump (not shown). Note that VCC' can be held constant at VCC, or, as in the preferred embodiment, can be held at VCC in write and erase modes and at VCC+Vt in read mode so that full VCC signals appear on the OUTPUT node.

The transistor M6 has a gate coupled to the INPUT signal, a source tied to the VCC node and a drain that is connected to the drain of the n-channel transistor M4 at node D. The gate of the transistor M4 is tied to the INPUT signal and its source is coupled to a virtual ground node providing a signal GND2. The signal GND2 is selected to be approximately equal to the threshold voltage of a n-channel enhancement mode transistor, such as the transistor M4. Node D is also coupled to the gate of the native-mode transistor M3, whose other terminals are connected to the VCC node and node B. The device M6 is relatively weak, having a width/length ratio of 2/10. The pulldown device M4 is stronger, having a width/length ratio of 6/2. The devices M3, M4 and M6 constitute a biasing network 120 responsive to the GND2 and INPUT signals that establishes a voltage at node B ($V_B$) that virtually eliminates leakage from the VPP node when the pump is inactive.

Figure 3B:
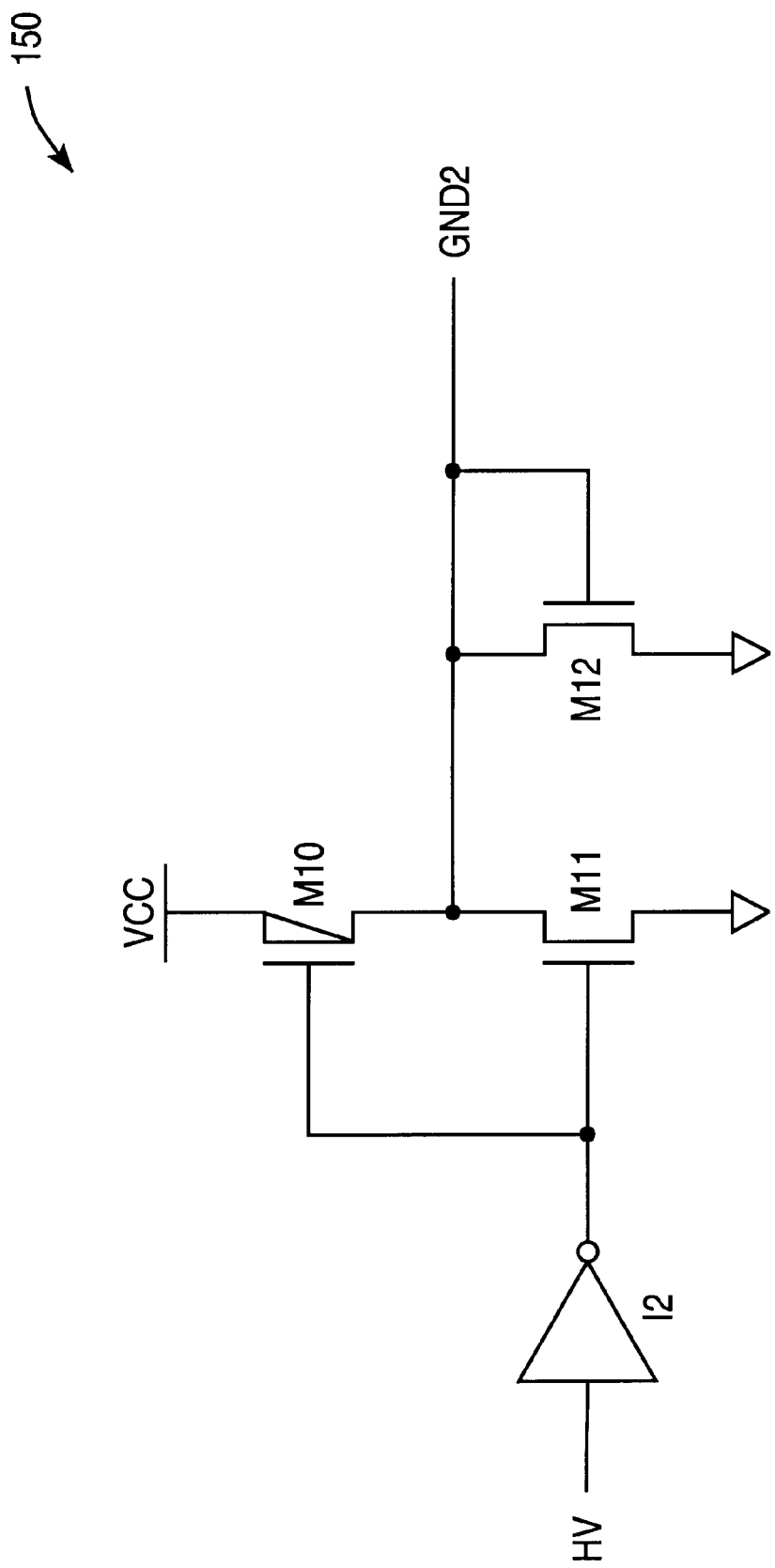
FIG. 3B is a schematic diagram of a circuit that generates the GND2 signal of FIG. 3A.

Referring to FIG. 3B, there is shown a schematic of a preferred circuit 150 for generating the GND2 signal. This circuit 150 includes an inverter 12, a p-channel transistor M10 and two n-channel transistors M11 (size 10/1.2), M12 (size 60/1.2). The input of the inverter 12 is coupled to an HV signal, which is asserted by an external controller when the distribution charge pump is to operate in a high voltage mode. This circuit is centralized, meaning that the entire memory of FIG. 1 includes only one such circuit 150 to generate a single GND2 signal shared by all of the distribution charge pumps 110. This reduces the size of each distribution charge pump 110 and also the current drawn by each distribution charge pump 150. In the circuit 150, when the HV signal is high, the level of the GND2 signal is set by the transistors M10 and M12, both of which are on. Because the transistor M12 is much stronger than the transistor M10 (which might have a size of 2/2), the GND2 signal level is close to (i.e., slightly higher than) the threshold voltage ($Vt_{M12}$) of the transistor M12. When the HV signal is low, the transistor M11 pulls the GND2 signal down to the ground level. As a result, when the INPUT signal is inactive, the voltage at node D is set by the transistors M4 and M6 to a voltage level that is at least as high as the threshold voltage $Vt_{M12}$ of the transistor M12.

Referring again to FIG. 3A, when the INPUT signal is high (i.e., when the charge pump is inactive), the device M6 is off and the device M4 is on. As a result, the voltage at node D is set by the device M4 to the GND2 voltage level, which is at least as high as the threshold voltage $Vt_{M12}$. Whenever the INPUT signal is low (i.e., whenever the pump is active), the voltage established at node D by the biasing network 120 has no effect on the voltages at nodes B or C. It is now described how the biasing network 120 reduces, or eliminates, current leakage from the VPP node. It shall be assumed for the purposes of the present discussion that the HV signal is high (i.e., high voltage mode is enabled) and the GND2 signal is at least as high as the threshold voltage $Vt_{M12}$.

Following a transition in the INPUT signal from low (pump on) to high (pump off), the OUTPUT signal falls to 0V and the gate of the transistor M4 goes to VCC, causing the transistor M4 to turn on and couple the GND2 signal level to node D. As a result, the voltage at node D is guaranteed to be no lower than $Vt_{M12}$ (the node D voltage could be slightly higher than $Vt_{M12}$ due to the small, source-drain voltage across the transistor M4 and the pull-up action of the transistor M10 (FIG. 3B)). For the purposes of the present discussion, the voltage at node D is assumed to be equal to $Vt_{M12}$.

Given a voltage at node D approximately equal to $Vt_{M12}$, the native-mode transistor M3 turns on, which causes the voltage at node B ($V_B$) to be established as shown in Eq. (0):

$$V_B = Vt_{M12} - Vt_{M3} \qquad \text{Eq. (0)}$$

Preferably, $V_B$ is a low positive voltage that is less than 1.0V. Because node C (the OUTPUT node) is at 0V, this means that the gate source voltage ($V_{GS}$) of the transistor MP2 is established as shown in Eq. (1):

$$V_{GS} = 0 - V_B = 0 - (Vt_{M12} - Vt_{M3}) = Vt_{M3} - Vt_{M12} \qquad \text{Eq. (1)}$$

At this $V_{GS}$ level the transistor MP2 is back-biased and, therefore, off. For example, given a $Vt_{M3}$ of −0.2V and a $Vt_{M12}$ of 0.5V., $V_B$ is approximately 0.7V, resulting in a $V_{GS}$ of around −0.7V, well below the threshold voltage $Vt_{MP2}$ (assumed to be approximately −0.2V). Given that the transistor MP2 is off, leakage from the VPP node via the transistor M3 is reduced, if not eliminated. Of course, given that $V_B$ is likely to be above the threshold voltage of the transistor MP1, that device will be on, enabling a leakage current to flow from the VCC node to the ground node via the active transistor M3. This is not a problem due to the strength of the VCC power supply. Preferably, the transistors M3 and MP2 have similar characteristics (e.g., the same thresholds and dimensions), ensuring that $-V_B$ is always less than the threshold voltage $Vt_{MP2}$.

As already mentioned, the preferred embodiment provides a NAND gate that has one input coupled to the clock signal φ and the other input coupled to the output of the input buffer I1. The NAND gate's output φ' is coupled to one terminal of the capacitor MC at node A. Consequently the NAND gate blocks the clock signal φ by providing a high signal φ' as long as the charge pump is disabled (i.e., whenever the INPUT is high), which prevents leakage out of the capacitor MC. Whenever the charge pump is enabled (i.e., whenever the INPUT is low), the NAND gate provides a gated clock signal φ' that is the same as the input clock signal φ, except that the clock signals φ' and φ are 180 degrees out of phase. Thus, the NAND gate reduces power consumption when the charge pump is inactive.

Referring again to FIG. 3A, an alternative embodiment 130 could also be implemented without the NAND gate. This embodiment would still reduce the VPP leakage current but would also consume unnecessary power due to the continuous activity of the gated clock signal φ'. This circuit would also promote undesirable coupling between the clock φ and the OUTPUT signal due to fringe capacitance. For example, without the NAND gate high phases of the clock signal φ would be coupled to the gate of the transistor MP1 via the capacitor MC, causing more current to be drained from the transistors M3 or MP2 than if the NAND gate were present.

Modifications and variations may be made to the disclosed embodiments without departing from the subject and spirit of the invention as defined by the following claims.

What is claimed is:

1. A distribution charge pump for use in a non-volatile memory array that includes a plurality of memory cells that can be programmed, erased and read by a host device, said distribution charge pump comprising:

a charge pump section implemented entirely without high voltage p-channel devices with an input coupled to an input signal, an output coupled to an output signal and a clock input coupled to a clock signal, the charge pump section being configured, when the input signal and the clock signals are active, to pump the output signal approximately to a VPP voltage established at a VPP node; and a biasing network responsive to the input signal that is configured to reduce a current leakage by the charge pump section from the VPP node when the input signal is inactive.

2. The distribution charge pump of claim 1, wherein the charge pump section comprises:

a first n-channel transistor having a first threshold level that is responsive to the input signal and that is configured to pull up a voltage at a first internal node when the input signal is active, the first n-channel transistor being coupled to the VPP node;

a capacitor responsive to the clock signal that is configured to store charge at the first internal node when the clock signal is at a high level and discharge when the clock signal is at a low level; and a second n-channel transistor having a second threshold level that is responsive to the first node voltage and is configured to couple the output to the first internal node whenever the first node voltage exceeds the second threshold level, the second threshold level being greater than the first threshold level.

3. The distribution charge pump of claim 2, wherein:

the first threshold level is between approximately −0.2 V and 0.3 V; and the second threshold level is between approximately 0.4 V and 0.6 V.

4. The distribution charge pump of claim 2, wherein the capacitor is an N-channel enhancement device with a threshold level approximately between 0.2 VDC and 0.8 VDC.

5. The distribution charge pump of claim 2, wherein the biasing network sets the voltage on the first internal node at a small positive voltage, less than 1.0 VDC, when the input signal is inactive, so as to ensure that the first n-channel transistor is off.

6. The distribution charge pump of claim 1, further comprising a two input NAND gate having a first input responsive to the input signal, a second input coupled to a master clock node that supplies a master clock signal of the same period as the clock signal, and a NAND output that provides the clock signal, the NAND output supplying the clock signal to a capacitor in the charge pump section only when the input signal is active so that the current leakage is eliminated when the input signal is inactive.

7. The distribution charge pump of claim 2, wherein the biasing network comprises:

a third n-channel transistor having a third threshold level and a gate, source and drain coupled respectively to a second internal node, the first internal node and a VCC node that provides a VCC voltage;

a fourth n-channel transistor having a fourth threshold level and a gate, source and drain coupled respectively to the input signal, a virtual ground signal GND2 and the second internal node, the fourth threshold level being greater than the third threshold voltage level;

when the input signal is inactive, the biasing network is configured to set the voltage at the second internal node approximately to the GND2 signal level, causing the third n-channel, transistor to turn on and the voltage at the first internal node to be established at the bias voltage, which approximately equals the difference of the GND2 signal level and third threshold level.

8. The distribution charge pump of claim 7, wherein:

the first threshold level is between approximately −0.2 V and 0.3 V; and the second threshold level is between approximately 0.4 V and 0.6 V; and the third threshold level is between approximately −0.2 V and 0.3 V.

9. A distribution charge pump for use in a non-volatile memory array that includes a plurality of memory cells that can be programmed, erased and read by a host device, the distribution charge pump comprising:

a charge pump section with an input coupled to an input signal, an output coupled to an output signal and a clock input coupled to a clock signal, the charge pump section being configured, when the input signal is active, to pump the output signal approximately to a VPP voltage that exceeds a VCC voltage;

the charge pump including:

a first, n-channel transistor having a first threshold level that is responsive to the input signal and is configured to pull up a first node voltage at a first internal node when the input signal is active, the pullup transistor being coupled to a VPP node that provides the VPP voltage;

a capacitor responsive to the clock signal that is configured to store charge at the first internal node when the clock signal is at a high level and discharge when the clock signal is at a low level; and a second, n-channel transistor having a second threshold level that is responsive to the first node voltage and is configured to couple the output to the first node whenever the first node voltage exceeds the second threshold, the second threshold level being greater than the first threshold level; and a biasing network responsive to the input signal that is configured to set the first node to a back bias voltage level that reduces a current leakage from the VPP node via the first n-channel transistor when the input signal is inactive.

10. The distribution charge pump of claim 9, wherein the biasing network sets the back bias voltage level to a small positive voltage level, less than 1.0 VDC, when the input signal is inactive, so as to ensure that the first n-channel transistor is off.

11. The distribution charge pump of claim 9, wherein:

the first threshold level is between approximately −0.2 V and 0.3 V; and the second threshold level is between approximately 0.4 V and 0.6 V.

12. The distribution charge pump of claim 9, wherein the biasing network comprises:

a third n-channel transistor having a third threshold level and a gate, source and drain coupled respectively to a second internal node, the first internalnode and the VCC node;

a fourth, n-channel transistor having a fourth threshold level and a gate, source and drain coupled respectively to the input signal, a virtual ground signal GND2 and the second internal node, the GND2 signal level being set to approximately a threshold voltage level of an n-channel enhancement device; such that:

when the input signal is inactive, the biasing network is configured to set the voltage at the second internal node approximately to the GND2 signal level, causing the third n-channel transistor to turn on and the first node voltage to be established at the bias voltage, which approximately equals the difference of the GND2 signal level and the third threshold level.

13. The distribution charge pump of claim 13, wherein:

the first threshold level is between approximately −0.2 V and 0.3 V;

the second threshold level is between approximately 0.4 V and 0.6 V; and the third threshold level is between approximately −0.2 V and 0.3 V.

14. The distribution charge pump of claim 9, further comprising a two input NAND gate having a first input responsive to the first input signal, a second input coupled to a master clock node that supplies a master clock signal of the same period as the clock signal, and an output that provides the clock signal, the NAND output supplying the clock signal to the capacitor only when the input signal is active so that leakage from the capacitor is eliminated when the input signal is inactive.

15. The distribution charge pump of claim 9, wherein the capacitor is an n-channel enhancement device with a threshold voltage approximately between 0.2 VDC and 0.8 VDC.

16. The distribution charge pump of claim 9, wherein the VCC voltage is approximately between +2 VDC and +5 VDC and the VPP voltage is approximately between +11 VDC and +15 VDC.

17. The distribution charge pump of claim 7, further comprising a virtual ground generating circuit for generating the GND2 signal that includes:

an inverter formed from a fifth n-channel transistor and a second p-channel transistor with an input coupled to a high voltage (HV) signal and an output coupled to the GND2 signal;

a sixth n-channel transistor with a sixth threshold voltage, a gate and drain coupled to the output of the inverter and a source coupled to the ground node; such that, when the HV signal is asserted, the second p-channel transistor and sixth n-channel transistor establish the GND2 signal level at least as high as the sixth threshold.

18. The distribution charge pump of claim 17, wherein there is a single virtual ground generating circuit generating the GND2 signal for the memory array.

19. The distribution charge pump of claim 12, further comprising a virtual ground generating circuit for generating the GND2 signal that includes:

an inverter formed from a fifth n-channel transistor and a second p-channel transistor with an input coupled to a high voltage (HV) signal and an output coupled to the GND2 signal; and a sixth n-channel transistor with a sixth threshold voltage, a gate and drain coupled to the output of the inverter and a source coupled to the ground node;

such that, when the HV signal is asserted, the second p-channel transistor and sixth n-channel transistor establish the GND2 signal level at least as high as the sixth threshold voltage.

20. The distribution charge pump of claim 19, wherein there is a single ground generating circuit generating the GND2 signal for the memory array.

* * * * *